United States Patent
Akatsuka

(10) Patent No.: US 7,544,307 B2
(45) Date of Patent: Jun. 9, 2009

(54) METAL POLISHING LIQUID AND POLISHING METHOD USING IT

(75) Inventor: Tomohiko Akatsuka, Aichi (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/524,914

(22) Filed: Sep. 22, 2006

(65) Prior Publication Data

US 2007/0068086 A1    Mar. 29, 2007

(30) Foreign Application Priority Data

Sep. 22, 2005   (JP)  .............................. 2005-276006

(51) Int. Cl.
*C09K 13/00* (2006.01)

(52) U.S. Cl. ................ 252/79; 252/79.1; 252/79.2; 252/79.3; 252/79.4; 216/88; 134/2; 134/38; 438/689; 438/692

(58) Field of Classification Search ................ 252/79; 216/88; 134/2; 438/689
See application file for complete search history.

(56) References Cited

U.S. PATENT DOCUMENTS 4,116,699 A * 9/1978 Rooney .................... 252/79.4
6,604,987 B1 * 8/2003 Sun ............................ 451/41
2005/0282387 A1 * 12/2005 Sato et al. ................... 438/689
2006/0000808 A1 * 1/2006 Seki et al. ..................... 216/88
2006/0110923 A1 * 5/2006 Liu et al. ..................... 438/692

FOREIGN PATENT DOCUMENTS

| JP | 8-083780 A | 3/1996 |
|---|---|---|
| JP | 2001-127019 A | 5/2001 |
| JP | 2001-279231 A | 10/2001 |

* cited by examiner

Primary Examiner—Nadine Norton
Assistant Examiner—Maki Angadi
(74) Attorney, Agent, or Firm—Sughrue Mion, PLLC

(57) ABSTRACT

A metal polishing liquid which contains a compound represented by the following formula (1), an aromatic heterocyclic ring compound, and an oxidizing agent, and a chemical mechanical polishing method using the metal polishing liquid. In the formula (1), $R^1$ denotes an alkylene group, and $R^2$ and $R^3$ each separately denote a hydrogen atom, a halogen atom, an acyl group, an alkyl group, an alkenyl group, an alkynyl group, or an aryl group.

Formula (1)

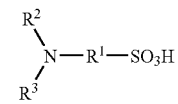

9 Claims, No Drawings

METAL POLISHING LIQUID AND POLISHING METHOD USING IT

CROSS-REFERENCE TO RELATED APPLICATION

This application claims priority under 35USC 119 from Japanese Patent Application No. 2005-276006, the disclosure of which is incorporated by reference herein.

BACKGROUND OF THE INVENTION

1. Field of the Invention

The present invention relates to manufacturing of a semiconductor device, and particularly, relates to a metal polishing liquid and a method for chemical mechanical polishing of metal in the wiring process of a semiconductor device.

2. Description of the Related Art

In the development of a semiconductor device represented by the semiconductor integrated circuit (hereinafter the term LSI is used), a higher density and a greater integration by making the wiring finer and stacking wiring have been demanded for more compact size and increased speed. In recent years, an LSI using copper, which has a low wiring resistance, as a metal for wiring has been developed. As the art for this, various techniques, such as the chemical mechanical polishing (hereinafter to be abbreviated to the CMP), and the like, have been adopted.

The CMP is an art for flattening the irregularities of the wafer surface that have been produced by stacking. The general method attaches a polishing pad to a circular polishing platen, wets the surface of the polishing pad with a polishing liquid, and presses the surface of the substrate (wafer) against the pad. Thereafter, from the rear face thereof, a prescribed pressure (polishing pressure) is applied, and both the polishing platen and the substrate are rotated for generating a mechanical friction by which the surface of the substrate is flattened.

The metal polishing liquid for use in CMP generally includes abrasive grains (made of, for example, alumina or silica), and an oxidizing agent (for example, hydrogen peroxide). Such a metal polishing liquid is considered to serve for polishing by oxidizing the metal surface with the oxidizing agent, and removing the resulting oxide film with the abrasive grains.

However, the use of such a metal polishing liquid for performing the CMP causes the insulating material between metal wirings to be polished more than required, producing polishing scratches, a phenomenon in which the entire polishing surface is polished more than required (thinning), or a phenomenon in which the entire polishing metal surface is not flattened, and only the central portion of the polishing metal surface is polished more deeply, resulting in a dish-like recess being produced (dishing). Further, a phenomenon, such as that in which a plurality of wiring metal surfaces form a dish-like recess (erosion), or the like, may be caused. Especially in recent years, because a still higher density and a still greater integration have been schemed, the request for reduction in dishing amount is becoming more and more strong. In addition, recently, for enhancing the productivity, the wafer diameter at the time of LSI manufacturing has been increased. Therefore, at present, a diameter of 200 mm or more is generally used, and manufacturing with a diameter as large as 300 mm or more has been commenced. With such an increase in size, the difference in polishing speed between the wafer central portion and the peripheral portion has been increased, and thus the demand for improvement in uniformity throughout the surface has become stringent. Further, recently, there has arisen a demand for a method which assures a sufficient polishing speed even when the polishing is performed with the pressure being lowered in order to prevent film peeling from being caused, even for an insulating material having a low mechanical strength.

To solve such problems, a metal polishing liquid which includes no abrasive grains, and is made up of hydrogen peroxide, malic acid, benzotriazole, ammonium polyacrylate, and water is disclosed in Japanese Patent Laid-Open Publication 2001-127019. According to this method, a conductor pattern with which a metallic film remains in the recess can be obtained. However, a problem that it is difficult to obtain a sufficient polishing speed has been left unsolved. In Japanese Patent Laid-Open Publication No. 2001-279231, a water-based dispersion for chemical mechanical polishing that contains an organic compound which suppresses the degradation of the polishing pad is disclosed. However, there remains a possibility of occurrence of the dishing phenomenon. As the dishing suppression method, a method which first performs the first-stage polishing at room temperature, and then lowers the system temperature to perform the second-stage polishing, thereby suppressing the dishing is disclosed in Japanese Patent Laid-Open Publication No. 8-83780/1996. However, an expensive process cost is involved, and no versatility is provided.

SUMMARY OF THE INVENTION

The present invention which has been made in view of the above circumstance and provide, as solutions to them, a metal polishing liquid and a chemical mechanical polishing method using such a polishing liquid which can achieve the reduction in dishing amount for the polishing workpiece in manufacturing a semiconductor device, and can be used for chemical mechanical flattening excellent in assuring the polishing speed ratio between the metal wiring made of copper, or the like, and the barrier metal as a film for copper diffusion prevention.

A first aspect of the present invention is to provide a metal polishing liquid containing:

a compound represented by the following formula (1), an aromatic heterocyclic ring compound, and an oxidizing agent:

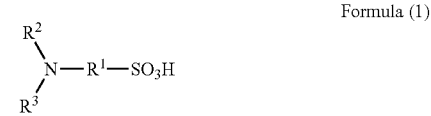

Formula (1)

wherein $R^1$ denotes an alkylene group, $R^2$ and $R^3$ each separately denote a hydrogen atom, a halogen atom, an acyl group, an alkyl group, an alkenyl group, an alkynyl group, or an aryl group.

A second aspect of the present invention is to provide a chemical mechanical polishing method including:

contacting the metal polishing liquid of the present invention with a surface to be polished, and polishing by relatively moving the surface to be polished and a polishing surface:

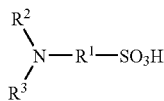

Formula (1)

wherein $R^1$ denotes an alkylene group, $R^2$ and $R^3$ each separately denote a hydrogen atom, a halogen atom, an acyl group, an alkyl group, an alkenyl group, an alkynyl group, or an aryl group.

DETAILED DESCRIPTION OF THE INVENTION

Hereinbelow, an embodiment of the present invention will be described.

(Metal Polishing Liquid)

The metal polishing liquid of the present invention contains a compound represented by the following formula (1), an aromatic heterocyclic ring compound, and an oxidizing agent as components. The metal polishing liquid preferably contains abrasive grains. Normally, it takes the form of slurry in which abrasive grains are dispersed in an aqueous solution in which the respective ingredients are dissolved.

The respective ingredients which the metal polishing liquid contains will be described below. Only one type of the respective ingredients may be used, or more than one type may be used in combination with one another.

The term "metal polishing liquid" used in the present invention refers not only to the polishing liquid having a composition (concentration) which is used for polishing, but also to a polishing concentrated liquid which is diluted at the time of use, as required, unless otherwise noted. The concentrated liquid is used for polishing, being diluted before use, with water, an aqueous solution, or the like. The dilution factor is generally 1 to 20 by volume.

Next, the ingredients of the polishing liquid of the present invention will be described.

(Compound Represented by Formula (1))

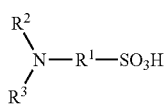

Formula (1)

$R^1$ denotes an alkylene group.

$R^2$ and $R^3$ each separately denote a hydrogen atom, a halogen atom, an acyl group, an alkyl group, an alkenyl group, an alkynyl group, or an aryl group.

The compound represented by the formula (1) is one of the "organic acids" so called in the industry, and greatly pertains to the speed of polishing the copper wiring. The organic acids conventionally known are amino acids, such as glycine, and the like, and carboxylic acids, such as malic acid, tartaric acid, citric acid, and the like. Compared to the well-known organic acids, the amino acid of the above-mentioned formula of the present invention suppresses the occurrence of dishing, having a high polishing speed ratio between the copper wiring and the barrier metal.

The mechanism is not clear, however, it is estimated that the high dissociability of the sulfonic acid group is an effector.

The alkylene group as $R^1$ in the formula (1) may be straight-chain, branched, or cyclic. It preferably has 1 to 8 carbons, and more preferably has 1 to 3 carbons. Examples thereof include methylene group, and ethylene group. Examples of the substituent which the alkylene group may have include a hydroxyl group, a halogen atom, and the like.

In the formula (1), $R^2$ and $R^3$ each separately denote a hydrogen atom, a halogen atom, an acyl group, an alkyl group, an alkenyl group, an alkynyl group, or an aryl group. The alkyl group, alkenyl group, and alkynyl group represented by $R^2$ and $R^3$ may be straight-chain, branched, or cyclic.

The alkyl group as $R^2$ and $R^3$ preferably has 1 to 8 carbons. Examples thereof include methyl group and ethyl group.

The acyl group as $R^2$ and $R^3$ preferably has 2 to 9 carbons. Examples thereof include methyl carbonyl group.

Examples of the substituent which the respective groups as $R^2$ and $R^3$ may have include a hydroxyl group, an amino group, and a halogen atom.

The table below gives typical compounds represented by the formula (1), however, the compound represented by the formula (1) is not limited to these.

FORMULA (1)

$\underset{R^3}{\overset{R^2}{\diagdown}} N - R^1 - SO_3H$

| | $R^1$ | $R^2$ | $R^3$ |
|---|---|---|---|
| Compound 1 | —$CH_2$— | —H | —H |
| Compound 2 | —$CH_2CH_2$— | —H | —H |
| Compound 3 | —$CH_2CH_2$— | —H | —$CH_3$ |
| Compound 4 | —$CH_2CH_2$— | —H | —CO—$NH_2$ |
| Compound 5 | —$CH_2CH_2$— | —H | —$C(CH_2OH)_3$ |
| Compound 6 | —$CH_2CH_2$— | —$CH_3$ | —$CH_3$ |
| Compound 7 | —$CH_2CH_2$— | —$CH_3$ | —$CH_2CH_2OH$ |
| Compound 8 | —$CH_2CH_2$— | —$CH_2CH_2$—O—$CH_2CH_2$— | |
| | | (a cyclic structure) | |
| Compound 9 | —$CH_2CH_2$— | —$CH_2CH_2OH$ | —$CH_2CH_2OH$ |
| Compound 10 | —$CH_2(OH)CH_2$— | —$CH_2CH_2OH$ | —$CH_2CH_2OH$ |
| Compound 11 | —$CH_2(OH)CH_2$— | —H | —H |
| Compound 12 | —$CH(CH_3)$— | —H | —H |
| Compound 13 | —$CH(CH_3)$— | —$CH_2CH_2OH$ | —$CH_2CH_2OH$ |
| Compound 14 | —$CH(CH_3)$— | —$CH_3$ | —H |
| Compound 15 | —$CH(CH_2CH_3)$— | —H | —H |

The amount of addition of the compound represented by the formula (1) is preferably 0.0005 mol to 0.5 mol per liter of the polishing liquid for use in polishing; is more preferably 0.005 mol to 0.3 mol; and is particularly preferably 0.01 mol to 0.1 mol. In other words, the amount of addition is preferably 0.5 mol or less from the viewpoint of etching suppression. In order to obtain a sufficient effect, it is preferably 0.0005 mol or more.

(Aromatic Heterocyclic Ring Compound)

The metal polishing liquid of the present invention contains an aromatic heterocyclic ring compound as a compound for forming a passive film on the metal surface as the polishing object. In the present invention, the term "aromatic heterocyclic ring compound" refers to a compound having an aromatic ring containing at least one hetero atom.

The number of hetero atoms included in the aromatic heterocyclic ring compound is not limited. The aromatic heterocyclic ring compound preferably has two or more hetero atoms. The aromatic heterocyclic ring compound is further preferably a compound having four or more hetero atoms. Particularly, using an aromatic heterocyclic ring compound having three or more nitrogen atoms is preferable. If an aromatic heterocyclic ring compound having four or more nitrogen atoms is used, a noticeable effect of the present invention is obtained, which is preferable.

In addition, the aromatic heterocyclic ring may be a monocyclic ring or a polycyclic ring having a fused ring(s). The number of ring members in case of a monocyclic ring is preferably 5 to 7, and is particularly preferably 5. The number of rings in case of a polycyclic ring having a fused ring(s) is preferably 2 or 3.

Specific examples of these heterocyclic rings include pyrrole ring, thiophene ring, furan ring, pyran ring, thiopyran ring, imidazole ring, pyrazole ring, thiazole ring, isothiazole ring, oxazole ring, isoxazole ring, pyridine ring, pyrazine ring, pyrimidine ring, pyridazine ring, pyrrolidine ring, pyrazolidine ring, imidazolidine ring, isoxazolidine ring, isothiazolidine ring, piperidine ring, piperazine ring, morpholine ring, thiomorpholine ring, chroman ring, thiochroman ring, isochroman ring, isothiochroman ring, indoline ring, isoindoline ring, pyrindine ring, indolizine ring, indole ring, indazole ring, purine ring, quinolizine ring, isoquinoline ring, quinoline ring, naphthylidine ring, phthalazine ring, quinoxaline ring, quinazoline ring, cinnoline ring, pteridine ring, acridine ring, perimidine ring, phenanthroline ring, carbazole ring, carboline ring, phenazine ring, anthyridine ring, thiadiazole ring, oxadiazole ring, triazine ring, triazole ring, tetrazole ring, benzimidazole ring, benzoxazole ring, benzothiazole ring, benzothiadiazole ring, benzofuroxan ring, naphthoimidazole ring, benzotriazole ring, tetraazaindene ring, and the like; and more preferable examples include triazole ring, and tetrazole ring.

Examples of the substituent which can be introduced into the aromatic heterocyclic ring compound for use in the present invention include the followings.

Examples of the substituent which the heterocyclic ring has include a halogen atom, an alkyl group (an alkyl group which is straight chain, branched or cyclic, and may be a polycyclic alkyl group as the bicycloalkyl group or include an active methine group), an alkenyl group, an alkynyl group, an aryl group, an amino group, and a hetero ring group. Further, two or more of a plurality of substituents may be bound to form a ring, such as an aromatic ring, an aliphatic hydrocarbon ring, an aromatic heterocyclic ring, or the like.

Specific examples of the aromatic heterocyclic ring compound which can be particularly preferably used in the present invention include, but not limited to, the followings.

They are 1,2,3,4-tetrazole, 5-amino-1,2,3,4-tetrazole, 5-methyl-1,2,3,4-tetrazole, 1,2,3-triazole, 4-amino-1,2,3-triazole, 4,5-diamino-1,2,3-triazole, 1,2,4-triazole, 3-amino-1,2,4-triazole, 3,5-diamino-1,2,4-triazole, and benzotriazole.

The aromatic heterocyclic ring compound to be used in the present invention may be of one type alone or of more than one type combined with one another. In addition, the aromatic heterocyclic ring compound to be used in the present invention can be synthesized in accordance with the conventional method. Or otherwise, a commercially available item may be used.

The amount of addition of the aromatic heterocyclic ring compound used in the present invention is preferably 0.0001 to 0.1 mol per liter of the total amount of the metal polishing liquid when used in polishing (in other words, the metal polishing liquid after dilution when diluted with water or an aqueous solution; the wording "the metal polishing liquid when used in polishing" used hereinafter means the same); is more preferably 0.0005 to 0.05 mol; and further preferably 0.0005 to 0.01 mol. If the amount of addition is under 0.0001 mol, the dishing amount will not be reduced, and if the amount of addition is over 0.1 mol, the polishing speed may be remarkably reduced.

(Oxidizing Agent)

The metal polishing liquid of the present invention contains a compound (an oxidizing agent) which can oxidize the metal as the polishing object.

Specific examples of the oxidizing agent include hydrogen peroxide, a peroxide, a nitrate, an iodate, a periodate, a hypochlorite, a chlorite, a chlorate, a perchlorate, a persulfate, a dichromate, a permanganate, ozone water and a silver(II) salt, an iron(III) salt. Among these, hydrogen peroxide is more preferably used.

The amount of addition of the oxidizing agent is preferably 0.003 mol to 8 mol per liter of the metal polishing liquid when used in polishing; is more preferably 0.03 mol to 6 mol; and is particularly preferably 0.1 mol to 4 mol. In other words, the amount of addition of the oxidizing agent is preferably 0.003 mol or more from the viewpoint of providing sufficient oxidization of the metal, and assurance of the CMP speed. From the viewpoint of prevention of the polishing surface from being roughened, the amount of addition of the oxidizing agent is preferably 8 mol or less.

(Organic Acid)

Besides the organic acid represented by the above-mentioned formula (1), the metal polishing liquid of the present invention can contain an organic acid so long as it will not impair the effects of the present invention. As such an organic acid, a water soluble one is desirable, and amino acids and organic acids other than those are further preferable.

As such an amino acid, that which is selected from the following group of amino acids is suitable.

They are glycine, L-alanine, β-alanine, L-2-amino butyric acid, L-norvaline, L-valine, L-leucine, L-norleucine, L-isoleucine, L-alloisoleucine, L-phenylalanine, L-proline, sarcosine, L-ornithine, L-lysine, taurine, L-serine, L-threonine, L-allothreonine, L-homoserine, L-tyrosine, 3,5-diiodo-L-tyrosine, β-(3,4-dihydroxyphenyl)-L-alanine, L-thyroxine, 4-hydroxy-L-proline, L-cystine, L-methionine, L-ethionine, L-lanthionine, L-cystathionine, L-cystine, L-cystinic acid, L-aspartic acid, L-glutamic acid, S-(carboxymethyl)-L-cystine, 4-amino butyric acid, L-asparagine, L-glutamine, azaserine, L-arginine, L-canavanine, L-citrulline, δ-hydroxy-L-lysine, creatine, L-kynurenine, L-histidine, 1-methyl-L-histidine, 3-methyl-L-histidine, ergothioneine, L-tryptophan, actinomycin C1, apamin, angiotensin I, angiotensin II and antipain, and the like.

As the organic acid other than the amino acid, that which is selected from the following group of organic acids is suitable.

They are formic acid, acetic acid, propionic acid, butyric acid, valeric acid, 2-methyl-butyric acid, n-hexanoic acid, 3,3-dimethyl-butyric acid, 2-ethyl butyric acid, 4-methyl-pentanoic acid, n-heptanoic acid, 2-methyl-hexanoic acid, n-octanoic acid, 2-ethyl-hexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, hydroxyethyl imino diacetic acid, imino diacetic acid, dihydroxyethyl glycine, and the salts of these, such as the ammonium salts, the alkali metal salts, and the like. Among these, malic acid, tartaric acid, citric acid, hydroxyethyl imino diacetic acid, imino diacetic acid, dihydroxyethyl glycine, and the like are suitable.

The content of the organic acid which is added besides the organic acid represented by the formula (1) is preferably 0.0005 to 5 mol per liter of the metal polishing liquid, and is more preferably 0.01 to 0.5 mol.

(Abrasive Grain)

The metal polishing liquid of the present invention preferably contains abrasive grains. Examples of the preferable abrasive grains include abrasive grains made of silica (precipitated silica, fumed silica, colloidal silica, and synthetic silica), ceria, alumina, titania, zirconia, germania, manganese oxide, silicon carbide, polystyrene, polyacryl, polyterephthalate, and the like. Particularly, if abrasive grains made of colloidal silica are used, a noticeable effect of the present invention is obtained, which is preferable.

As the amount of addition of the abrasive grains, it is preferable to include 0.05 to 20 g of abrasive grains per liter of the metal polishing liquid when used in polishing, and particularly if 0.2 to 5 g of abrasive grains are included, a noticeable effect of the present invention is obtained, which is preferable.

In addition, the abrasive grains preferably have a volumetric average particle diameter of 5 to 200 nm, and particularly if the abrasive grains having a volumetric average particle diameter of 20 to 70 nm are used, a noticeable effect of the present invention is obtained, which is preferable.

The metal polishing liquid of the present invention may further contain some other ingredients, and examples thereof include a surfactant, a solvent-philic polymer, and, other additives.

(Surfactant/Hydrophilic Polymer)

The polishing liquid of the present invention preferably contains a surfactant or a hydrophilic polymer.

The surfactant and the hydrophilic polymer both have an action of lowering the contact angle for the surface to be polished, promoting uniform polishing. As the surfactant or the hydrophilic polymer to be used, that which is selected from the following group is suitable.

As the anionic surfactant, a carboxylate, a sulfonate, a sulfuric ester salt, and a phosphoester salt can be used; as the cationic surfactant, an aliphatic amine salt, a quaternary aliphatic ammonium salt, benzalkonium chloride, benzethonium chloride, a pyridinium salt, and an imidazolinium salt can be used; as the ampholytic surfactant, a carboxybetaine type one, an amino carboxylate, imidazolinium betaine, lecithin, and an alkyl amine oxide can be used; as the nonionic surfactant, an ether type one, an ether-ester type one, an ester type one, and the nitrogen-containing type one can be used; and the fluorine-based surfactant, and the like can be used. Further, as the hydrophilic polymer, polyglycols, such as polyethylene glycol, and the like; polyvinyl alcohol, polyvinyl pyrrolidone, polysaccharides, such as alginic acid, and the like; and carboxylic acid-containing polymers, such as polymethacrylic acid, and the like; and the like can be used.

Among the above-mentioned substances, the acids or otherwise the ammonium salts thereof are desirable because contamination due of an alkali metal, an alkaline earth metal, a halide, or the like, will not be caused. Among the above-mentioned example compounds, specifically, cyclohexanol, ammonium polyacrylate, polyvinyl alcohol, succinamide, polyvinyl pyrrolidone, polyethylene glycol, polyoxyethylene-polyoxypropylene block polymer are more preferable.

The weight-average molecular weight of these surfactants and hydrophilic polymers is preferably 500 to 100000, and is particularly preferably 2000 to 50000.

The amount of addition of the surfactant and hydrophilic polymer is preferably 0.001 to 10 g in total per liter of the amount of the metal polishing liquid when used in polishing; is more preferably 0.01 to 5 g; and is particularly preferably 0.1 to 3 g.

(pH Adjuster)

The metal polishing liquid of the present invention preferably contains an alkali/acid or a buffer agent in order to obtain a prescribed pH. Preferable examples of the alkali/acid or the buffer agent include nonmetallic alkaline chemicals, such as organic ammonium hydroxides, such as ammonium hydroxide, tetramethyl ammonium hydroxide, and the like; alkanol amines, such as diethanol amine, triethanol amine, triisopropanol amine, and the like; alkali metal hydroxides, such as sodium hydroxide, potassium hydroxide, lithium hydroxide, and the like; inorganic acids, such as nitric acid, sulfuric acid, phosphoric acid, and the like; carbonates, such as sodium carbonate, and the like; phosphates, such as tertiarysodium phosphate, and the like; borate, tetraborate, hydroxy benzoate, and the like. Ammonium hydroxide, potassium hydroxide, lithium hydroxide and tetramethyl ammonium hydroxide are particularly preferable alkaline chemicals.

As the amount of addition of the alkali/acid or the buffer agent, it may be of any value, provided that the pH is maintained in the preferable range, and the value of the amount of addition is preferably 0.0001 mol to 1.0 mol per liter of the metal polishing liquid when used in polishing, and is more preferably 0.003 mol to 0.5 mol.

The pH value of the metal polishing liquid when used in polishing is preferably 3 to 12; is more preferably 4 to 9; and particularly 5 to 8. In this range, the metal polishing liquid of the present invention exerts a particularly excellent effect.

(Chelating Agent)

The metal polishing liquid of the present invention may contain a chelating agent, as required, in order to minimize the adverse effects of the multivalent metallic ions, and the like, included as contaminants. As the chelating agent, the general-purpose water softener as a precipitation inhibitor for calcium and magnesium and the related compounds thereof can be used, and two or more types of these may be used in combination with one another, as required.

The amount of addition of the chelating agent may be of any value, provided that it is sufficient to nullify the effects of the multivalent metallic ions, and the like, included as contaminants, and for example, the chelating agent is added such that the amount of addition is 0.0003 mol to 0.07 mol per liter of the metal polishing liquid when used in polishing.

Next, the semiconductor integrated circuit wafer to be polished will be described.

(Wiring Metal Material)

The polishing object in the present invention is an LSI having a wiring made up of copper or a copper alloy, and among the copper alloys, the copper alloy which contains silver is suitable. The silver contained in the copper alloy exerts an excellent effect at a content of 10% by mass or less, and further 1% by mass or less, and exerts the most excellent effect at a content in the range of 0.00001 to 0.1% by mass.

(Width of Wiring)

The semiconductor as the object in the present invention is preferably an LSI having a wiring of 0.15 µm or less in half pitch for the DRAM device family, for example; particularly 0.10 µm or less; and further 0.08 µm or less. On the other hand, for the MPU device family, the object semiconductor is preferably an LSI having a wiring of 0.12 µm or less in half pitch; particularly 0.09 µm or less; and further 0.07 µm or less. On these LSIs, the polishing liquid of the present invention exerts a particularly excellent effect.

(Barrier Metal)

Between the copper wiring and the interlayer insulation film, a barrier layer for prevention of copper diffusion can be provided. As the barrier layer, low-resistance metallic materials, for example, TiN, TiW, Ta, TaN, W, WN, and Ru are preferable, and among these, Ta and TaN are particularly preferable. Because these barrier materials themselves have a conductive nature, it is preferable to thoroughly remove the barrier material on the insulation layer for prevention of occurrence of a fault, such as current leakage, and the like. The metal polishing liquid of the present invention can be exemplarily used for polishing of such a barrier layer.

(Insulation Film)

As the insulation film, an inorganic insulation film or an organic insulation film can be applied. As the method for preparing an inorganic insulation film, the constant pressure CVD method, the plasma CVD method, and the like can be used. As the organic insulation film, a coating type insulation film made up of a product of hydrolysis of tetraalkoxysilane as the principal ingredient, and an interlayer insulation film, called an organic SOG film, made up of polyorganosiloxane as the principal ingredient, having a low specific inductive capacity can be used.

Next, the polishing method will be described.

(Polishing Apparatus)

As the apparatus which can implement the present invention, a general polishing apparatus which has a holder for holding a semiconductor substrate having a surface to be polished, and the like, and a polishing platen to which a polishing pad is attached (to which a variable-speed motor, and the like, are mounted) can be used, and there is no particular limitation to the apparatus used, provided that it can polish a wafer with a diameter of 300 mm, as exemplified by a FREX 300 polishing machine (Ebara Corporation).

(Polishing Liquid Supply Method)

In the present invention, the metal polishing liquid is continuously supplied to the polishing pad on the polishing platen by means of a pump, or the like, while the object metal is being polished. The supply rate is not limited, however, it is preferable that the surface of the polishing pad is always covered with the polishing liquid.

In the present invention, a concentrated metal polishing liquid can also be used, being admixed with water or an aqueous solution for dilution. Examples of the dilution method include the method which joins the pipe for supplying the concentrated metal polishing liquid and the pipe for supplying water or the aqueous solution with each other on the way for mixing, and supplies the diluted metal polishing liquid to the polishing pad, and the like. For mixing in this case, the method which is generally used, such as that which passes the liquids through a narrow passage under pressure for causing them to be collided with each other for mixing; that which packs a filler, such as a glass tube, or the like, in the pipe for repeating of splitting and separating the stream of liquid, and joining the streams; that which provides a vane rotated by power in the pipe; or the like can be used.

In addition, as another dilution method, the method which separately provides the pipe for supplying the metal polishing liquid and the pipe for supplying water or an aqueous solution, and through the respective pipes, supplies a prescribed amount of liquid to the polishing pad for mixing both liquids by means of a relative motion between the polishing pad and the surface to be polished can be used in the present invention.

Further, the method which places prescribed amounts of the concentrated metal polishing liquid and water or an aqueous solution in a single container for mixing with each other, and after diluting the mixture to a prescribed concentration, supplies it to the polishing pad can be applied to the present invention.

Besides these methods, the method which divides the ingredients to be contained in the metal polishing liquid into at least two components, and in using them, adds water or an aqueous solution to them for dilution before supplying to the polishing pad can be used in the present invention. In this case, it is preferable that the ingredients to be contained in the metal polishing liquid be divided into the component including an oxidizing agent and the component including an acid, before being supplied.

For example, the oxidizing agent is provided as one component (A), while the acid, additive, surfactant and water are provided as another component (B), and before using the component (A) and the component (B), they are diluted with water or an aqueous solution. In this case, there is the need for three pipes for supplying the component (A), the component (B), and water or the aqueous solution, respectively, and the three pipes may be joined to one another to form a single pipe leading to the polishing pad in order to mix all the liquids in the same pipe, or appropriate two pipes may be joined to each other into a single pipe, which is then joined to another pipe for mixing the liquids. For example, the component including an additive which is difficult to be dissolved is mixed with the other component, and after passing the mixture through a long mixing path to positively provide the time period required for dissolution, the pipe for water or an aqueous solution is joined, whereby the polishing liquid can be supplied to the polishing pad.

In addition, the above-mentioned three pipes may be guided to the polishing pad, respectively, for mixing the liquids by the relative motion between the polishing pad and the surface to be polished before supplying to the polishing pad, or the three components may be mixed into a single container before being supplied as a mixture to the polishing pad. Further, the metal polishing liquid may be a concentrated liquid, with the dilution water being separately supplied to the polishing surface.

(Pad)

For the pad for polishing that is used in implementing the chemical mechanical polishing method using the metal polishing liquid of the present invention, there is no particular limitation, and the pad may be either an unfoamed structure pad or a foamed structure one. The former uses a synthetic resin bulk material as hard as a plastic plate as a pad. In addition, the latter is available as an independent foam (a dry foamed item), a continuous foam (a wet foamed item), or a two-layer composite (a laminated item), and the two-layer composite (the laminated item) is particularly preferable. The foamed cells may be uniform or non-uniform.

Further the pad may contain abrasive grains (made of, for example, ceria, silica, alumina, resin, or the like) for use in polishing. In addition, each type of material is available with a low or high hardness; the hardness may be either low or high; and in the laminated item, the respective layers preferably have different hardnesses. As the material, unwoven fabric, artificial leather, polyamide, polyurethane, polyester, polycarbonate, and the like are preferable. In addition, the surface which is to be contacted with the polishing surface may be machined for giving latticed grooves, holes, concentric grooves, spiral grooves, or the like.

EXAMPLES

Hereinbelow, the present invention will be described with reference to EXAMPLEs. However, the present invention are not limited to these EXAMPLEs.

Example 1

The following polishing liquid was prepared.

(Preparation of Polishing Liquid)
Hydrogen peroxide (an oxidizing agent, manufactured by KANTO CHEMICAL CO., INC.) 10 g/L
Iminodiacetic acid (manufactured by DOJINDO LABORATORIES) 15 g/L
The specific example compound 1 (as given in the previous table) (manufactured by Wako Pure Chemical Industries, Ltd.) 14 g/L
Benzotriazole (an aromatic heterocyclic ring compound, manufactured by Wako Pure Chemical Industries, Ltd.) 0.5 g/L
Colloidal silica (abrasive grains, manufactured by FUSO CHEMICAL CO., LTD.) 10 g/L
Pure water added for a total amount of 1000 mL
The polishing agent was pH 6.8 (adjusted with aqua ammonia and nitric acid).

Examples 2 to 18 and Comparative Examples 1 to 4

The polishing liquids in EXAMPLEs 2 to 18 and COMPARATIVE EXAMPLEs 1 to 4 were prepared in the same manner as in EXAMPLE 1, except the compounds as given in the following Table 1 were used.

For the above-mentioned polishing liquids prepared in EXAMPLEs 1 to 18 and COMPARATIVE EXAMPLEs 1 to 4, the following methods were used to conduct the polishing test for CMP speed and dishing amount, and from the results of the CMP speed measurement, the polishing speed ratio (the selection ratio) between copper and tantalum was determined.

(Polishing Test)
The members and apparatus as well as the polishing conditions used for the polishing test are as follows:
Polishing pad: IC1400 K-Grv (Rodale, Inc.)
Polishing machine: LGP-612 (Lapmaster SFT Corp.)
Holding-down pressure: 140 kPa
Polishing liquid supply rate: 200 ml/min
Copper blanket wafer: A wafer (200 mm) on which a copper film 1.5 μm thick was formed
Tantalum blanket wafer: A wafer (200 mm) on which a tantalum film 1 μm thick was formed
Pattern wafer: A pattern wafer (200 mm), CMP854 manufactured by ATDF Inc.
Polishing linear speed: 1.0 m/sec
Platen controlled temperature: 20° C.

<CMP Speed>
For 17 places on the wafer surface, the thicknesses of the metallic film before and after the CMP were obtained by converting the electric resistance values for determining the average polishing speed. The measuring apparatus used was a DC 4-point probe type sheet resistance measuring instrument VR-120 (manufactured by Hitachi Kokusai Electric Inc.).

<Dishing>
A commercially available pattern wafer was polished to measure the dishing amount for the 100—(m wiring portion of the wafer. The object to be polished was a 854 mask pattern wafer (manufactured by Sematech, Inc.), and as the measuring apparatus, the contact type step height measuring apparatus Dektak V320SI (manufactured by Veeco Instruments, Inc.) was used.

Table 1 shows the results.

TABLE 1

| | Compound represented by formula (1) | Aromatic heterocyclic ring compound | Selection ratio (Cu/Ta) | Dishing amount (nm) |
|---|---|---|---|---|
| EXAMPLE 1 | Compound 1 | Benzotriazole | 275 | 100 |
| EXAMPLE 2 | Compound 2 | Benzotriazole | 320 | 80 |
| EXAMPLE 3 | Compound 3 | Benzotriazole | 34 | 150 |
| EXAMPLE 4 | Compound 4 | Benzotriazole | 105 | 120 |
| EXAMPLE 5 | Compound 5 | Benzotriazole | 42 | 110 |
| EXAMPLE 6 | Compound 7 | Benzotriazole | 38 | 150 |
| EXAMPLE 7 | Compound 8 | Benzotriazole | 43 | 150 |
| EXAMPLE 8 | Compound 9 | Benzotriazole | 120 | 120 |
| EXAMPLE 9 | Compound 11 | Benzotriazole | 273 | 120 |
| EXAMPLE 10 | Compound 12 | Benzotriazole | 293 | 110 |
| EXAMPLE 11 | Compound 13 | Benzotriazole | 37 | 150 |
| EXAMPLE 12 | Compound 14 | Benzotriazole | 35 | 140 |
| EXAMPLE 13 | Compound 15 | Benzotriazole | 249 | 110 |
| EXAMPLE 14 | Compound 1 | 1H-tetrazole | 290 | 80 |
| EXAMPLE 15 | Compound 1 | 1,2,3-triazole | 260 | 130 |
| EXAMPLE 16 | Compound 1 | Quinaldic acid | 280 | 180 |
| COMPARATIVE EXAMPLE 1 | not given | Benzotriazole | 15 | 170 |
| COMPARATIVE EXAMPLE 2 | 1-butane sulfonic acid | Benzotriazole | 16 | 170 |
| COMPARATIVE EXAMPLE 3 | Compound 2 | not given | 320 | 250 |
| COMPARATIVE EXAMPLE 4 | not given | not given | 15 | 290 |

As can be seen from Table 1, the effects of the present invention that the polishing liquid which is used by the polishing method of the present invention provides a high polishing speed ratio between copper and tantalum, and reduces the dishing amount has been most noticeably recognized.

(1) As described above, the present invention provides a metal polishing liquid comprising:
a compound represented by the following formula (1), an aromatic heterocyclic ring compound, and an oxidizing agent:

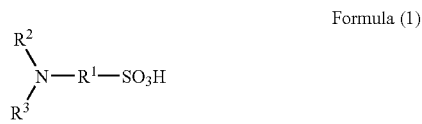

Formula (1)

wherein $R^1$ denotes an alkylene group, $R^2$ and $R^3$ each separately denote a hydrogen atom, a halogen atom, an acyl group, an alkyl group, an alkenyl group, an alkynyl group, or an aryl group.

(2) The present invention provides the metal polishing liquid as stated in the above item (1), wherein $R^1$ of the formula (1) is an alkylene group having 1 to 8 carbon atoms.

(3) The present invention provides the metal polishing liquid as stated in the above item (1), wherein the aromatic heterocyclic ring compound is at least one selected from 1,2,3,4-tetrazole, 5-amino-1,2,3,4-tetrazole, 5-methyl-1,2,3,4-tetrazole, 1,2,3-triazole, 4-amino-1,2,3-triazole, 4,5- diamino-1,2,3-triazole, 1,2,4-triazole, 3-amino-1,2,4-triazole, 3,5-diamino-1,2,4-triazole, and benzotriazole.
(4) The present invention provides the metal polishing liquid as stated in the above item (1), further comprising abrasive grains.
(5) The present invention provides the metal polishing liquid as stated in the above item (4), wherein the abrasive grains are made of colloidal silica.
(6) The present invention provides the metal polishing liquid as stated in any one of the above items (1) to (5), which is used for polishing a semiconductor integrated circuit.
(7) A chemical mechanical polishing method comprising contacting the metal polishing liquid above items (1) to (5) with a surface to be polished, and polishing by relatively moving the surface to be polished and a polishing surface.

According to the polishing liquid of the present invention and the polishing method using it, a high polishing speed can be obtained with the occurrence of dishing on the wafer surface being suppressed, and a high polishing speed ratio between the copper wiring and the barrier metal can be assured.

What is claimed is:

1. A metal polishing liquid comprising:
a compound represented by the following formula (1), an aromatic heterocyclic ring compound, and an oxidizing agent:

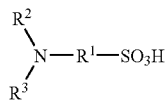

Formula (1)

wherein $R^1$ denotes an alkylene group having 1 to 8 carbon atoms, $R^2$ and $R^3$ each separately denote a hydrogen atom, a halogen atom, an acyl group, an alkyl group, an alkenyl group, an alkynyl group, or an aryl group.

2. The metal polishing liquid of claim 1, wherein the aromatic heterocyclic ring compound is at least one selected from 1,2,3,4-tetrazole, 5-amino-1,2,3,4-tetrazole, 5-methyl-1,2,3,4-tetrazole, 1,2,3-triazole, 4-amino-1,2,3-triazole, 4,5-diamino-1,2,3-triazole, 1,2,4-triazole, 3-amino-1,2,4-triazole, 3,5-diamino-1,2,4-triazole, and benzotriazole.

3. The metal polishing liquid of claim 1, further comprising abrasive grains.

4. The metal polishing liquid of claim 3, wherein the abrasive grains are made of colloidal silica.

5. The metal polishing liquid of claim 1, the liquid is used for polishing a semiconductor integrated circuit.

6. A chemical mechanical polishing method comprising:
contacting a metal polishing liquid that comprises a compound represented by the following formula (1), an aromatic heterocyclic ring compound, and an oxidizing agent with a surface to be polished, and polishing by relatively moving the surface to be polished and a polishing surface:

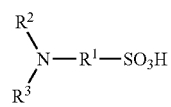

Formula (1)

wherein $R^1$ denotes an alkylene group having 1 to 8 carbon atoms, $R^2$ and $R^3$ each separately denote a hydrogen atom, a halogen atom, an acyl group, an alkyl group, an alkenyl group, an alkynyl group, or an aryl group.

7. The chemical mechanical polishing method of claim 6, wherein the aromatic heterocyclic ring compound is at least one selected from 1,2,3,4-tetrazole, 5-amino-1,2,3,4-tetrazole, 5-methyl-1,2,3,4-tetrazole, 1,2,3-triazole, 4-amino-1,2,3-triazole, 4,5-diamino-1,2,3-triazole, 1,2,4-triazole, 3-amino-1,2,4-triazole, 3,5-diamino-1,2,4-triazole, and benzotriazole.

8. The chemical mechanical polishing method of claim 6, further comprising abrasive grains.

9. The chemical mechanical polishing method of claim 8, wherein the abrasive grains are made of colloidal silica.

* * * * *